United States Patent
Tomioka

(10) Patent No.: US 8,547,175 B2
(45) Date of Patent: Oct. 1, 2013

(54) OUTPUT CIRCUIT

(75) Inventor: Tsutomu Tomioka, Chiba (JP)

(73) Assignee: Seiko Instruments Inc., Chiba (JP)

( * ) Notice: Subject to any disclaimer, the term of this patent is extended or adjusted under 35 U.S.C. 154(b) by 89 days.

(21) Appl. No.: 13/355,736

(22) Filed: Jan. 23, 2012

(65) Prior Publication Data

US 2012/0188019 A1 Jul. 26, 2012

(30) Foreign Application Priority Data

Jan. 25, 2011 (JP) ................... 2011-013325

(51) Int. Cl.
*H03F 3/26* (2006.01)
(52) U.S. Cl.
CPC ..................... *H03F 3/265* (2013.01)
USPC .......................... 330/264; 330/267

(58) Field of Classification Search
USPC ................................... 330/264, 267
See application file for complete search history.

(56) References Cited

U.S. PATENT DOCUMENTS

| | | | |
|---|---|---|---|
| 5,442,320 A * | 8/1995 | Kunst et al. ................... | 330/267 |
| 5,606,287 A | 2/1997 | Kobayashi et al. | |
| 7,057,459 B2 * | 6/2006 | Ueno ........................... | 330/255 |
| 7,327,194 B2 * | 2/2008 | Li ................................. | 330/264 |

* cited by examiner

*Primary Examiner* — Steven J Mottola
(74) *Attorney, Agent, or Firm* — Brinks Hofer Gilson & Lione

(57) ABSTRACT

Provided is an output circuit capable of allowing a more sufficient output current to flow. When a drain current of a PMOS transistor (12) is large, a PMOS transistor (13) operates in the non-saturation region. At this time, gate voltages of NMOS transistors (14 and 17) have risen to around a power supply terminal voltage. Therefore, a gate-source voltage of an NMOS transistor (17) increases, and a sufficient output current flows.

5 Claims, 3 Drawing Sheets

OUTPUT CIRCUIT

RELATED APPLICATIONS

This application claims priority under 35 U.S.C. §119 to Japanese Patent Application No. 2011-013325 filed on Jan. 25, 2011, the entire content of which is hereby incorporated by reference.

BACKGROUND OF THE INVENTION

1. Field of the Invention

The present invention relates to an output circuit.

2. Description of the Related Art

A conventional output circuit is described. FIG. 6 is a circuit diagram illustrating the conventional output circuit.

When an input signal voltage is applied to an input terminal IN, the input signal voltage is converted into a drain current via a PMOS transistor 50. This drain current is converted into an output voltage by output impedance at an output terminal OUT. The input signal voltage is also converted into a drain current via a PMOS transistor 51. The difference between this drain current and a current supplied by a constant current source 56 flows as a drain current of a PMOS transistor 52. This drain current becomes a drain current of an NMOS transistor 55 via a current mirror circuit formed of the PMOS transistor 52 and a PMOS transistor 53 and a current mirror circuit formed of an NMOS transistor 54 and the NMOS transistor 55. This drain current is converted into an output voltage by output impedance at the output terminal OUT. In this way, the input signal voltage appears at the output terminal OUT after amplified by both the PMOS transistor 50 and the NMOS transistor 55 connected to the output terminal OUT. This circuit has better efficiency and higher gain than a Class-A output circuit configuration of amplifying by an output PMOS transistor alone or a Class-A output circuit configuration of amplifying by an output NMOS transistor alone (see, for example, Japanese Patent Application Laid-open No. Hei 08-8654 (FIG. 2)).

The conventional output circuit can obtain a large source current, but, because the NMOS transistor 54 is saturation-connected, a gate voltage of the NMOS transistor 55 cannot rise more than the level of a threshold voltage of the NMOS transistor 54. Accordingly, there has been a problem that a high gate-source voltage cannot be obtained in the NMOS transistor 55 and hence a large sink current does not flow, resulting in an insufficient output current.

SUMMARY OF THE INVENTION

The present invention has been made in view of the above-mentioned problem, and provides an output circuit capable of allowing a sufficient output current to flow.

In order to solve the above-mentioned problem, the present invention provides an output circuit configured as follows.

An output circuit according to the present invention includes: a first MOS transistor of a first conductivity type including a source connected to a first power supply terminal; a second MOS transistor of the first conductivity type including a gate connected to a gate of the first MOS transistor of the first conductivity type and a source connected to the first power supply terminal; a first current source including one terminal connected to a drain of the second MOS transistor of the first conductivity type and another terminal connected to a second power supply terminal; a first current mirror circuit including a third MOS transistor of the first conductivity type and a fourth MOS transistor of the first conductivity type, the first current mirror circuit including an input terminal and an output terminal, the input terminal being connected to the one terminal of the first current source and receiving, as an input, a current corresponding to a difference between a current flowing through the first current source and a drain current of the second MOS transistor of the first conductivity type; a first MOS transistor of a second conductivity type including a gate and a drain which are connected to the output terminal of the first current mirror circuit; a second current source including one terminal connected to a source of the first MOS transistor of the second conductivity type and another terminal connected to the second power supply terminal; a third current source including one terminal connected to the first power supply terminal; a second MOS transistor of the second conductivity type including a gate connected to another terminal of the third current source, a source connected to the one terminal of the second current source, and a drain connected to the first power supply terminal; a third MOS transistor of the second conductivity type including a gate and a drain which are connected to the another terminal of the third current source and a source connected to the second power supply terminal; and a fourth MOS transistor of the second conductivity type including a gate connected to the drain of the first MOS transistor of the second conductivity type, a source connected to the second power supply terminal, and a drain connected to the drain of the first MOS transistor of the first conductivity type.

According to the output circuit of the present invention configured as described above, when a drain current of the fourth MOS transistor of the first conductivity type is larger than a current supplied by the third current source, a gate voltage of the fourth MOS transistor of the second conductivity type is at the level around a voltage of the first power supply terminal. Therefore, the output circuit of the present invention has an effect that a sufficient output current can be allowed to flow as compared to the conventional output circuit.

DETAILED DESCRIPTION OF THE PREFERRED EMBODIMENT

Hereinafter, an embodiment of the present invention is described with reference to the accompanying drawings.

Figure 1:
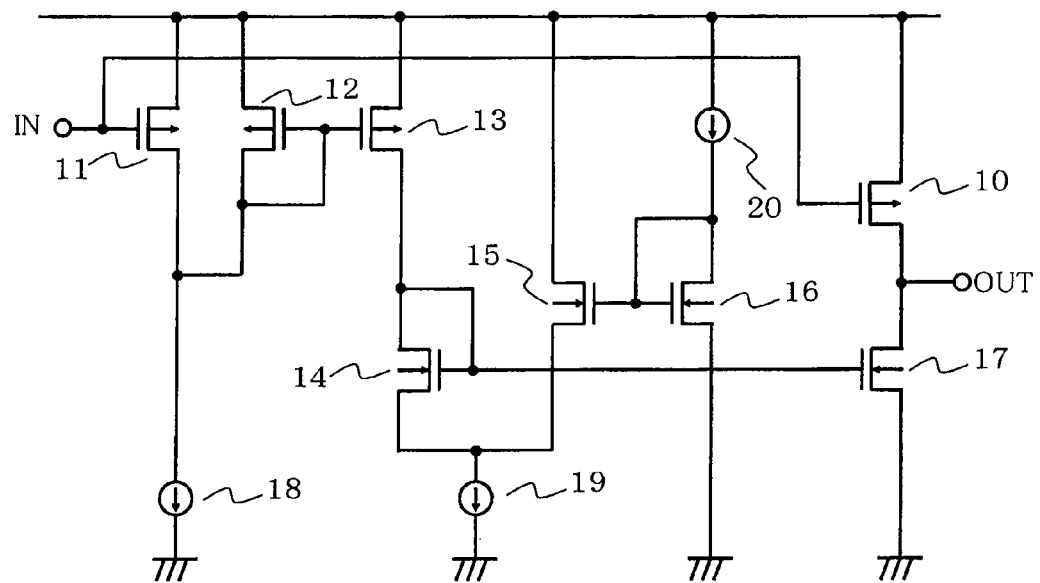
FIG. 1 is a circuit diagram illustrating an output circuit according to an embodiment of the present invention.

First, a configuration of an output circuit is described. FIG. 1 is a circuit diagram illustrating an output circuit of this embodiment.

The output circuit of this embodiment includes PMOS transistors 10 to 13, NMOS transistors 14 to 17, and constant current sources 18 to 20.

The PMOS transistor 10 has a gate connected to an input terminal IN, a source connected to a power supply terminal, and a drain connected to an output terminal OUT. The PMOS transistor 11 has a gate connected to the input terminal IN, a source connected to the power supply terminal, and a drain connected to a gate and a drain of the PMOS transistor 12 and one terminal of the constant current source 18. The other terminal of the constant current source 18 is connected to a ground terminal. The PMOS transistor 12 has a source connected to the power supply terminal. The PMOS transistor 13 has a gate connected to the gate of the PMOS transistor 12, a source connected to the power supply terminal, and a drain connected to a gate and a drain of the NMOS transistor 14. Note that, the PMOS transistors 12 and 13 form a current mirror circuit. The NMOS transistor 14 has a source connected to one terminal of the constant current source 19 and a source of the NMOS transistor 15. The other terminal of the constant current source 19 is connected to the ground terminal. The NMOS transistor 15 has a drain connected to the power supply terminal, and a gate connected to a gate and a drain of the NMOS transistor 16 and one terminal of the constant current source 20. The other terminal of the constant current source 20 is connected to the power supply terminal. The NMOS transistor 16 has a source connected to the ground terminal. The NMOS transistor 17 has a gate connected to the gate of the NMOS transistor 14, a source connected to the ground terminal, and a drain connected to the output terminal OUT.

Next, an operation of the output circuit is described.

When an input signal voltage is applied to the input terminal IN, the input signal voltage is converted into a drain current via the PMOS transistor 10. This drain current is converted into an output voltage by output impedance at the output terminal OUT. The input signal voltage is also converted into a drain current via the PMOS transistor 11. The difference between this drain current and a current supplied by the constant current source 18 flows as a drain current of the PMOS transistor 12. This drain current is mirrored, in accordance with a mirror ratio, to a drain current of the PMOS transistor 13 forming the current mirror circuit together with the PMOS transistor 12, and then flows into the constant current source 19 via the saturation-connected NMOS transistor 14. At this time, the difference between a current supplied by the constant current source 19 and the drain current of the PMOS transistor 13 flows as a drain current of the NMOS transistor 15. Here, a gate voltage of the NMOS transistor 15 is a constant voltage generated when a current supplied by the constant current source 20 flows into the saturation-connected NMOS transistor 16. Accordingly, if the drain current of the NMOS transistor 15 changes, a source voltage of the NMOS transistor 15 changes in accordance with the change amount, and a source voltage of the NMOS transistor 14 connected to the source of the NMOS transistor 15 also changes in the same way. A gate-source voltage of the NMOS transistor 14 is determined by the drain current supplied by the PMOS transistor 13. Therefore, a gate voltage of the NMOS transistor 14 also changes by the change amount of the source voltage of the NMOS transistor 14. The change of the gate voltage is converted into a drain current via the NMOS transistor 17. This drain current is converted into an output voltage by output impedance at the output terminal OUT.

Next, description is given of how a large sink current flows when a gate-source voltage of the NMOS transistor 17 increases.

Hereinafter, it is assumed that a prior-stage circuit connected to the input terminal IN is capable of generating a signal voltage ranging from a ground terminal voltage to a power supply terminal voltage.

When the input signal voltage applied to the input terminal IN is around the power supply terminal voltage, a gate-source voltage of the PMOS transistor 11 is smaller than a threshold voltage thereof, and almost no drain current flows. Accordingly, most of the current supplied by the constant current source 18 flows as the drain current of the PMOS transistor 12. At this time, the gate voltage and the source voltage of the saturation-connected NMOS transistor 14 rise so that the PMOS transistor 13 operates in the non-saturation region and the PMOS transistor 13 allows a drain current substantially equal to the current supplied by the constant current source 19 to flow. Because the gate voltage of the NMOS transistor 14 has risen to around the power supply terminal voltage, a gate voltage of the NMOS transistor 17 connected to the gate of the NMOS transistor 14 also rises to around the power supply terminal voltage. Accordingly, a gate-source voltage of the NMOS transistor 17 increases, and a large drain current flows.

Further, when the input signal voltage applied to the input terminal IN is around the power supply terminal voltage, a gate-source voltage of the PMOS transistor 10 is smaller than a threshold voltage thereof, and almost no drain current flows.

Therefore, a large sink current flows in this circuit.

Next, description of given of how a large source current flows when the gate-source voltage of the NMOS transistor 17 becomes smaller than the threshold voltage thereof.

When the input signal voltage applied to the input terminal IN is around the ground terminal voltage, the gate-source voltage of the PMOS transistor 11 is large. At this time, most of the current supplied by the constant current source 18 flows as the drain current of the PMOS transistor 11. Accordingly, the drain current of the PMOS transistor 12 does not flow, and the drain current of the PMOS transistor 13 forming the current mirror circuit does not flow, either. Then, most of the current supplied by the constant current source 19 flows as the drain current of the NMOS transistor 15, and the gate-source voltage of the NMOS transistor 15 increases. The gate voltage of the NMOS transistor 15 is a constant voltage, and hence, because of the increase of the gate-source voltage, the source voltage of the NMOS transistor 15 reduces to around the ground terminal voltage. Further, the source voltage of the NMOS transistor 14 connected to the source of the NMOS transistor 15 also reduces to around the ground terminal voltage in the same way. The gate-source voltage of the saturation-connected NMOS transistor 14 is determined by the drain current supplied by the PMOS transistor 13, and hence the gate voltage of the NMOS transistor 14 follows the source voltage of the NMOS transistor 14 and reduces to around the ground terminal voltage. The gate voltage of the NMOS transistor 17 connected to the gate of the NMOS transistor 14 also reduces to around the ground terminal voltage. Accordingly, the gate-source voltage of the NMOS transistor 17 becomes smaller than the threshold voltage thereof, and almost no drain current flows.

Further, when the input signal voltage applied to the input terminal IN is around the ground terminal voltage, the gate-source voltage of the PMOS transistor 10 increases, and a large drain current flows.

Therefore, a large source current flows in this circuit.

Next, a circuit operation in an idling state is described.

When the gate-source voltage of the NMOS transistor 14 is represented by VGS14; the gate-source voltage of the NMOS transistor 15, VGS15; the gate-source voltage of the NMOS transistor 16, VGS16; and the gate-source voltage of the NMOS transistor 17, VGS17, Expression (1) below is satisfied.

$$VGS17 = VGS16 - VGS15 + VGS14 \quad (1)$$

On this occasion, if the circuit is designed so that the NMOS transistors 14 and 15 have the same aspect ratio and the drain currents flowing through the NMOS transistors 14 and 15 become half the current supplied by the constant current source 19, Expression (1) is modified to Expression (2) below.

$$VGS17 = VGS16 \quad (2)$$

Expression (2) shows that the NMOS transistors 16 and 17 have a relationship similar to a current mirror circuit. When the aspect ratio of the NMOS transistor 16 is represented by K16; the aspect ratio of the NMOS transistor 17, K17; the drain current of the NMOS transistor 17, I17; and the current of the constant current source 20, I20, Expression (3) below is satisfied.

$$I17 = (K17/K16) \cdot I20 \quad (3)$$

Expression (3) shows that, by appropriately designing the current of the constant current source 20 and the aspect ratios of the NMOS transistors 16 and 17, the drain current of the NMOS transistor 17 can be set to a small current. Also as to the drain current of the PMOS transistor 10, by applying the gate voltage of the PMOS transistor 10 so that this drain current becomes equal to the drain current of the NMOS transistor 17, an idling current can be reduced.

The output circuit configured as described above is a Class-AB output circuit which allows a large sink current and a large source current to flow and has low current consumption in the idling state. Further, consumption currents other than the drain currents of the PMOS transistor 10 and the NMOS transistor 17 are determined by the constant current sources 18 to 20, and are thus independent of the input signal voltage.

Figure 5:
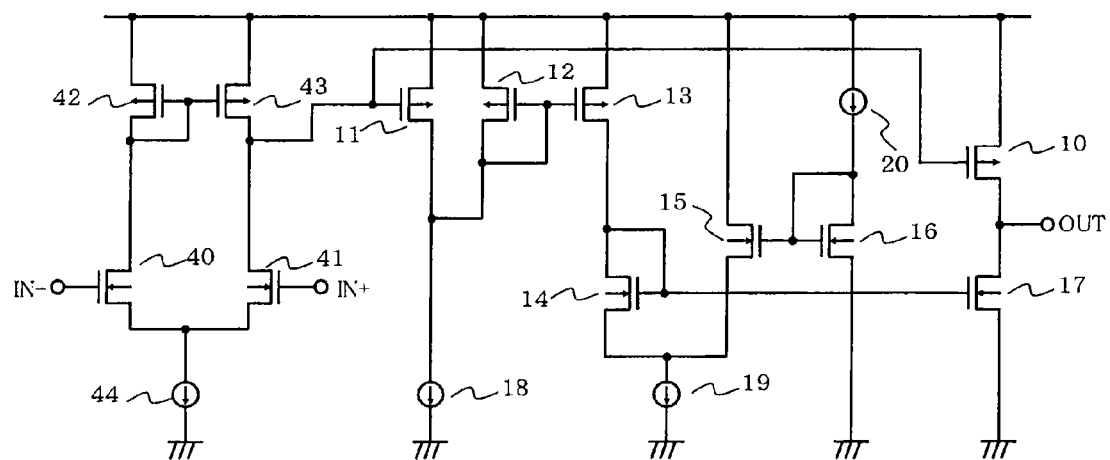
FIG. 5 is a circuit diagram illustrating an operational amplifier using the output circuit according to the embodiment of the present invention.
Figure 6:
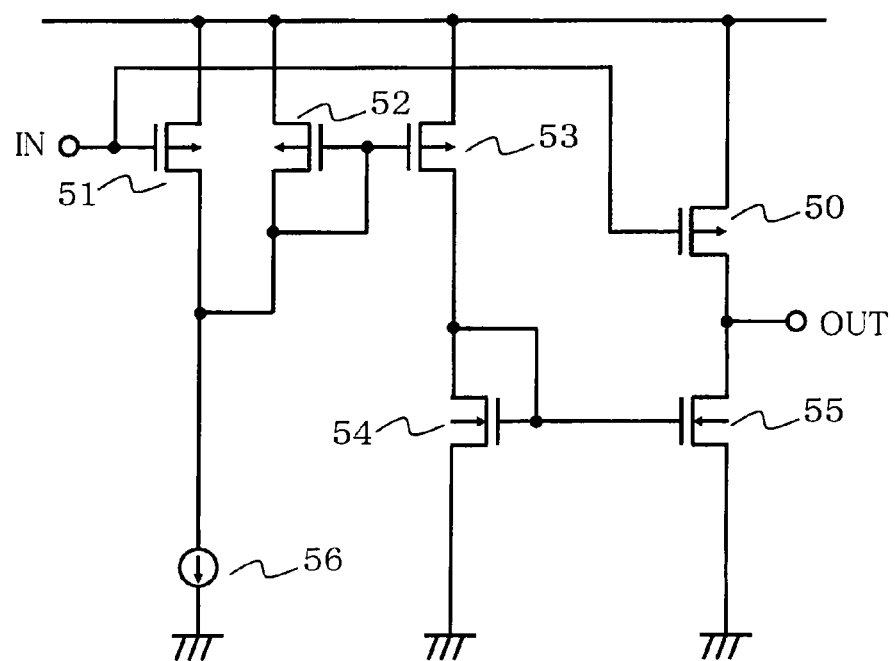
FIG. 6 is a circuit diagram illustrating a conventional output circuit.

A circuit of FIG. 5 is a two-stage operational amplifier combining the output circuit of this embodiment and an input differential amplifier stage. The input differential amplifier stage includes NMOS transistors 40 and 41, PMOS transistors 42 and 43, and a constant current source 44. In this operational amplifier, input signal voltages applied to gates of the NMOS transistors 40 and 41 are amplified and output from the output terminal OUT of the output circuit of this embodiment.

Modified Example 1

Figure 2:
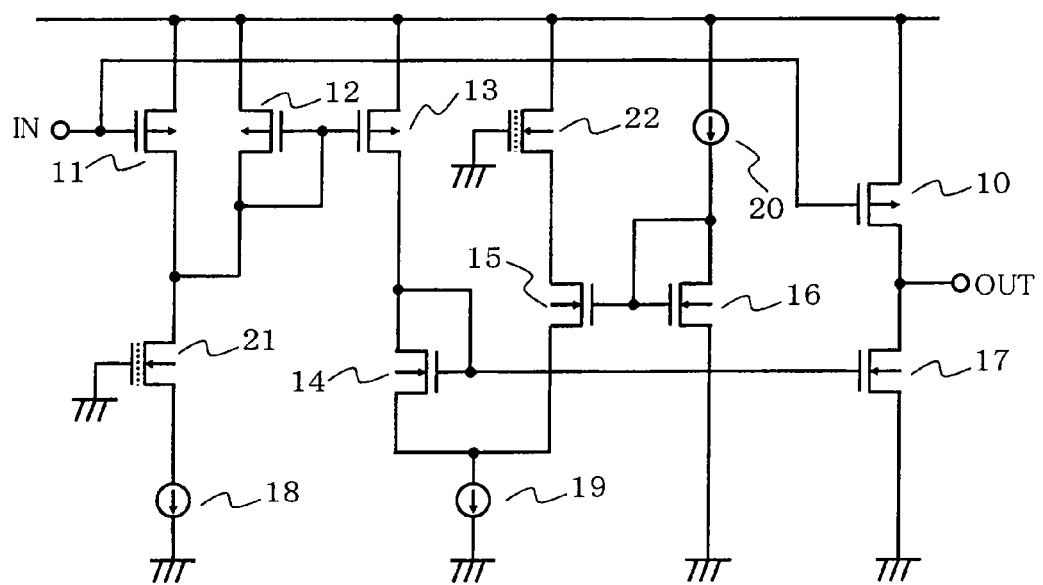
FIG. 2 is a circuit diagram illustrating another example of the output circuit according to the embodiment of the present invention.

FIG. 2 is a circuit diagram illustrating another example of the output circuit of this embodiment. Comparing with the circuit of FIG. 1, depletion mode NMOS transistors 21 and 22 are added. The depletion mode NMOS transistor 21 has a gate connected to the ground terminal, a source connected to the constant current source 18, and a drain connected to the drains of the PMOS transistors 11 and 12. The depletion mode NMOS transistor 22 has a gate connected to the ground terminal, a source connected to the drain of the NMOS transistor 15, and a drain connected to the power supply terminal.

It is assumed that the constant current source 18 is formed of an NMOS transistor. Consider the case where, in such circuit configuration, the power supply terminal voltage fluctuates, followed by fluctuations in drain voltages of the PMOS transistors 11 and 12. In this case, the depletion mode NMOS transistors 21 and 22 serve as cascode circuits, and hence the drain voltage of the NMOS transistor forming the constant current source 18 and the drain voltage of the NMOS transistor 15 less fluctuate. Therefore, the constant current source 18 and the NMOS transistor 15 are less affected by the channel length modulation effect.

Modified Example 2

Figure 3:
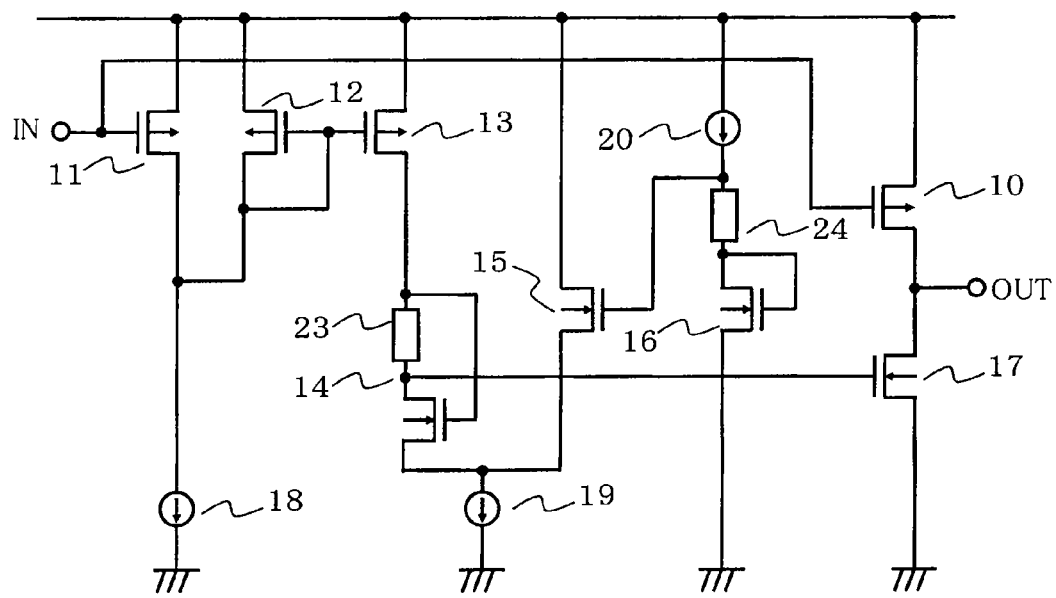
FIG. 3 is a circuit diagram illustrating still another example of the output circuit according to the embodiment of the present invention.

FIG. 3 is a circuit diagram illustrating still another example of the output circuit of this embodiment. Comparing with the circuit of FIG. 1, impedance elements 23 and 24 are added. The impedance element 23 has one terminal connected to the drain of the PMOS transistor 13 and the gate of the NMOS transistor 14, and the other terminal connected to the drain of the NMOS transistor 14 and the gate of the NMOS transistor 17. The impedance element 24 has one terminal connected to the one terminal of the constant current source 20 and the gate of the NMOS transistor 15, and the other terminal connected to the gate and the drain of the NMOS transistor 16. It is assumed that the constant current source 19 is formed of an NMOS transistor, one terminal of which is a drain.

In such circuit configuration, a voltage drop V19 of the constant current source 19 is represented as follows when a voltage drop of the impedance element 23 is represented by V23.

$$V19 = VGS17 + V23 - VGS14 \quad (4)$$

On this occasion, if VGS14 and VGS17 are designed to be equal to each other, Expression (4) is modified to Expression (5) below.

$$V19 = V23 \quad (5)$$

Expression (5) shows that the voltage of the one terminal of the constant current source 19 coincides with the voltage drop of the impedance element 23. Therefore, by designing a large voltage drop of the impedance element 23, the constant current source 19 operates in the saturation region.

Further, the gate-source voltage of the NMOS transistor 17 is expressed as follows when a voltage drop of the impedance element 24 is represented by V24.

$$VGS17 = VGS16 + V24 - VGS15 + VGS14 - V23 \quad (6)$$

On this occasion, if the circuit is designed so that the NMOS transistors 14 and 15 have the same aspect ratio and the drain currents flowing through the NMOS transistors 14 and 15 become half the current supplied by the constant current source 19, and if the voltage drops of the impedance elements 23 and 24 are designed to be equal to each other, Expression (6) is modified to Expression (7) below.

$$VGS17 = VGS16 \quad (7)$$

Expression (7) has the same relationship as in Expression (2), and hence Expression (3) is satisfied. Therefore, the circuit of FIG. 3 has a small idling current similarly to the circuit of FIG. 1.

Modified Example 3

Figure 4:
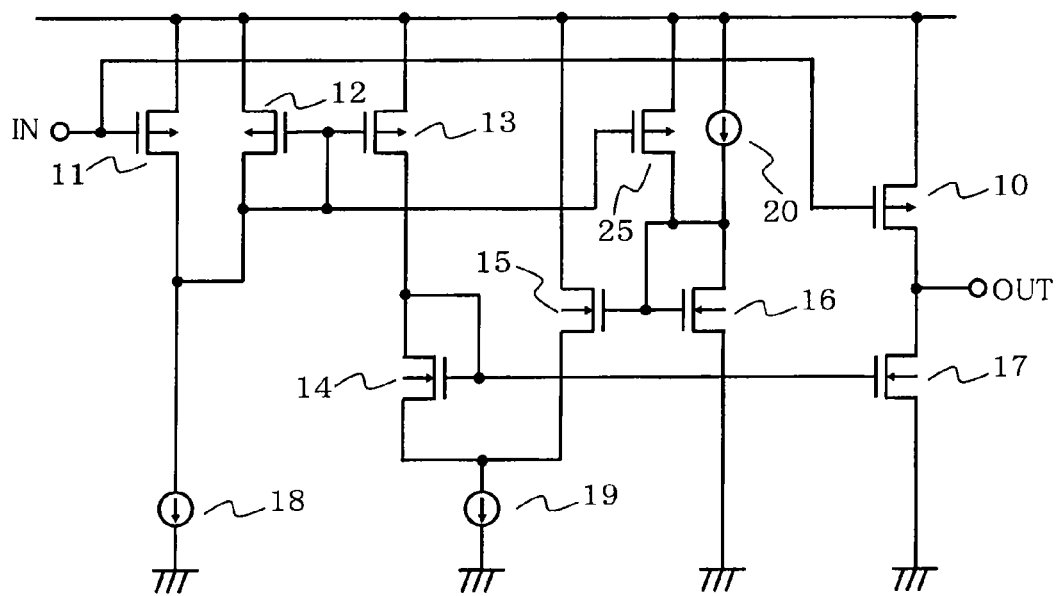
FIG. 4 is a circuit diagram illustrating yet another example of the output circuit according to the embodiment of the present invention.

FIG. 4 is a circuit diagram illustrating yet another example of the output circuit of this embodiment. Comparing with the circuit of FIG. 1, a PMOS transistor 25 is added. The PMOS transistor 25 has a gate connected to the one terminal of the constant current source 18, the drain of the PMOS transistor 11, the gate and the drain of the PMOS transistor 12, and the gate of the PMOS transistor 13. The PMOS transistor 25 has a source connected to the power supply terminal, and a drain connected to the one terminal of the constant current source 20, the gate of the NMOS transistor 15, and the gate and the drain of the NMOS transistor 16. The PMOS transistors 12 and 25 form a current mirror circuit, and the drain current of the PMOS transistor 12 is mirrored in accordance with a mirror ratio to become a drain current of the PMOS transistor 25. The drain current of the PMOS transistor 25 is added to the current supplied by the constant current source 20 and then flows into the saturation-connected NMOS transistor 16. Accordingly, when the input signal voltage is applied to the input terminal IN, the gate voltage of the NMOS transistor 16 changes in accordance with the change of the drain current of the PMOS transistor 25, followed by the change of the source voltage of the NMOS transistor 15. At this time, the change of the source voltage of the NMOS transistor 15 is in the same direction as the change of the gate voltage of the above-mentioned NMOS transistor 17, and thus enhances the change of the gate-source voltage of the NMOS transistor 17 more. Accordingly, a larger sink current and a larger source current flow.

What is claimed is:

1. An output circuit for amplifying a signal input to an input terminal and outputting the amplified signal from an output terminal, comprising:
   a first MOS transistor of a first conductivity type including a gate connected to the input terminal, a source connected to a first power supply terminal, and a drain connected to the output terminal;
   a second MOS transistor of the first conductivity type including a gate connected to the input terminal and a source connected to the first power supply terminal;
   a first current source including one terminal connected to a drain of the second MOS transistor of the first conductivity type and another terminal connected to a second power supply terminal;
   a current mirror circuit comprising a third MOS transistor of the first conductivity type and a fourth MOS transistor of the first conductivity type, for mirroring a current corresponding to a difference between a current of the first current source and a drain current of the second MOS transistor of the first conductivity type, the third MOS transistor of the first conductivity type including a gate and a drain which are connected to the one terminal of the first current source, the fourth MOS transistor of the first conductivity type including a gate connected to a gate of the third MOS transistor of the first conductivity type;
   a first MOS transistor of a second conductivity type including a gate and a drain which are connected to a drain of the fourth MOS transistor of the first conductivity type;
   a second current source including one terminal connected to a source of the first MOS transistor of the second conductivity type and another terminal connected to the second power supply terminal;
   a third current source including one terminal connected to the first power supply terminal;
   a second MOS transistor of the second conductivity type including a gate connected to another terminal of the third current source, a source connected to the one terminal of the second current source, and a drain connected to the first power supply terminal;
   a third MOS transistor of the second conductivity type including a gate and a drain which are connected to the another terminal of the third current source and a source connected to the second power supply terminal; and
   a fourth MOS transistor of the second conductivity type including a gate connected to the drain of the first MOS transistor of the second conductivity type, a source connected to the second power supply terminal, and a drain connected to the output terminal.

2. An output circuit according to claim 1, further comprising:
   a first cascode circuit provided to the one terminal of the first current source; and
   a second cascode circuit provided to the drain of the second MOS transistor of the second conductivity type.

3. An output circuit according to claim 2, wherein the first cascode circuit and the second cascode circuit each comprise a depletion mode MOS transistor of the second conductivity type including a gate connected to the second power supply terminal.

4. An output circuit according to claim 1, further comprising:
   a first impedance element provided to the drain of the first MOS transistor of the second conductivity type; and
   a second impedance element provided to the drain of the third MOS transistor of the second conductivity type.

5. An output circuit according to claim 1, wherein:
   the current mirror circuit further comprises a fifth MOS transistor of the first conductivity type;
   the fifth MOS transistor of the first conductivity type includes a gate connected to the gate of the third MOS transistor of the first conductivity type and a drain connected to the drain of the third MOS transistor of the second conductivity type; and
   the fifth MOS transistor of the first conductivity type mirrors a current corresponding to a difference between the current of the first current source and the drain current of the second MOS transistor of the first conductivity type.

* * * * *